(12) United States Patent
Jackson et al.

(10) Patent No.: US 9,748,181 B1
(45) Date of Patent: Aug. 29, 2017

(54) METHODS AND APPARATUS FOR CRACK PROPAGATION PREVENTION AND ENHANCED PARTICLE REMOVAL IN SCRIBE LINE SEALS

(71) Applicant: Texas Instruments Incorporated, Dallas, TX (US)

(72) Inventors: Ricky Alan Jackson, Richardson, TX (US); Sudtida Lavangkul, Richardson, TX (US); Erika Lynn Mazotti, San Martin, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/168,479

(22) Filed: May 31, 2016

(51) Int. Cl.
- *H01L 23/544* (2006.01)
- *H01L 23/00* (2006.01)
- *H01L 21/78* (2006.01)
- *H01L 23/31* (2006.01)
- *H01L 23/528* (2006.01)
- *H01L 23/532* (2006.01)

(52) U.S. Cl.
CPC .......... *H01L 23/562* (2013.01); *H01L 21/78* (2013.01); *H01L 23/3171* (2013.01); *H01L 23/528* (2013.01); *H01L 23/53261* (2013.01); *H01L 23/53266* (2013.01); *H01L 23/544* (2013.01); *H01L 2223/5446* (2013.01)

(58) Field of Classification Search
CPC ... H01L 23/562; H01L 23/3171; H01L 21/78; H01L 23/528

USPC ......................................................... 257/620
See application file for complete search history.

(56) References Cited

U.S. PATENT DOCUMENTS

| | | | |
|---|---|---|---|
| 6,521,975 B1 | 2/2003 | West et al. | |
| 7,453,128 B2 * | 11/2008 | Tsutsue | H01L 23/564 257/409 |
| 7,812,424 B2 * | 10/2010 | Barth | H01L 23/5223 257/532 |
| 8,125,052 B2 * | 2/2012 | Jeng | H01L 23/585 257/409 |
| 8,125,053 B2 | 2/2012 | West et al. | |
| 8,896,102 B2 * | 11/2014 | Zhang | H01L 21/78 257/620 |

* cited by examiner

*Primary Examiner* — Luan C Thai
(74) *Attorney, Agent, or Firm* — Kenneth Liu; Charles A. Brill; Frank D. Cimino

(57) ABSTRACT

An example apparatus includes a plurality of scribe streets arranged in rows and columns on the surface of a semiconductor wafer; and a plurality of integrated circuit dies arranged in rows and columns and spaced apart by the scribe streets. Each integrated circuit die includes plurality of active areas; a plurality of insulator layers overlying the active areas; a plurality of conductor layers interspersed with and separated by ones of the insulator layers; and a passivation layer overlying a top portion of the uppermost one of the conductor layers. A scribe seal in a scribe region surrounds the periphery of the integrated circuit dies, the scribe seal covered by the passivation layer; and a crack arrest structure is located surrounding and spaced from the scribe seal, and including an opening in the passivation layer that extends to and exposes the upper surface of the crack arrest structure. Methods are disclosed.

21 Claims, 7 Drawing Sheets

METHODS AND APPARATUS FOR CRACK PROPAGATION PREVENTION AND ENHANCED PARTICLE REMOVAL IN SCRIBE LINE SEALS

TECHNICAL FIELD

This application relates generally to the use of scribe line seals in semiconductor device and integrated circuit manufacture, and more particularly to the use of crack arrest structures in scribe line seals.

BACKGROUND

Integrated circuits are produced as dies on a semiconductor wafer. The semiconductor wafer is subjected to various processing steps, including: forming active areas within the semiconductor material by use of doping and ion implantation; deposition and patterning of insulator layers; and forming conductors such as metallic layers. The insulator layers are formed over the semiconductor substrate, and are also formed between and surrounding conductive layers such as doped polysilicon, aluminum, and copper conductors, and over the entire structure to provide electrical insulation between layers of conductors. Another insulator layer is formed over the entire device and is referred to as the "passivation layer." The passivation layer provides electrical insulation as well as protection from moisture and other impurities that can corrode or adversely affect the conductors and semiconductor substrate. The insulator layers are thin, brittle layers of materials that can be sometimes be considered ceramic materials, such as silicon oxide, silicon nitride, silicon oxynitride, silicon carbide, and polyimide, to name but a few.

After the integrated circuits are completely manufactured but while the integrated circuits still reside on a single semiconductor wafer, the devices are separated one from another. This operation is referred to as "singulation" or "dicing" of the semiconductor wafer. Singulation of integrated circuit devices from a semiconductor wafer includes physically separating the devices by a sawing or scribing operation. Mechanical sawing or laser sawing is used to saw through the semiconductor wafer in kerf lanes or scribe street areas that are defined between the integrated circuit dies. Laser scribing followed by a mechanical break along a scribed area is also sometimes used.

When the semiconductor wafer is sawed, cracks can form in the insulation layers at the kerf lane edge. Chips and cracks along the kerf lane are often visible after dicing. These cracks are formed because the mechanical sawing operation is relatively violent. During dicing or singulation, a rotating saw blade has to cut through the insulating layers, the conductor layers, and through the semiconductor wafer. The saw has significant vibration and heat is generated while the blade is rotating and cutting through these mechanically brittle layers. Cracks in a brittle insulator layer can propagate within that layer from the kerf lane into the surrounding areas. The cracks can propagate in the brittle insulator layers from the scribe street and into the integrated circuit dies and damage them. These cracks can destroy otherwise good integrated circuit devices. Even if a crack in an insulator layer does not propagate into the integrated circuit, cracks in the insulator layers can allow moisture incursion from the edge of the integrated circuit at the scribe line into the device. Moisture incursion contributes to corrosion of structures inside the integrated circuit and can lead to additional failures. Unwanted moisture can also increase the delamination of certain thin films deposited over the substrate within the integrated circuit. Other impurities can also enter the integrated circuit due to the cracks initiated in the sawing operation, even when the integrated circuit is still otherwise functional.

In alternative wafer dicing operations, laser cutting can be used. In one approach a laser is used to scribe trenches into the surface of the wafer, and the wafer is then broken mechanically along the cuts. In other approaches the laser is used to cut through the semiconductor wafer. In either of these laser dicing approaches, cracks in the insulating layers can also occur that can propagate from the kerf line and into the integrated circuit dies.

U.S. Pat. No. 6,521,975, entitled "Scribe Street Seals in Semiconductor Devices and Method of Fabrication," filed May 15, 2000, issued Feb. 18, 2003, listing West et. al. as inventors, which is co-owned with the present application, and which is hereby incorporated by reference in its entirety herein, describes forming scribe seals including conductors and conductive vias extending through the layers of insulators between conductors to prevent cracks from propagating from a dicing line where a semiconductor wafer is cut.

U.S. Pat. No. 8,125,053, entitled "Embedded Scribe Lane Crack Arrest Structure for Improved IC Package Reliability of Plastic Flip-Chip Devices," filed Feb. 4, 2004, issued Feb. 28, 2012, listing West et. al. as inventors, which is co-owned with the present application, and which is hereby incorporated by reference in its entirety herein, discloses adding crack arrest structures between the scribe streets and the scribe seals to further prevent crack propagation from the scribe line area.

SUMMARY

In described examples, scribe seals in a semiconductor wafer include a scribe region surrounding an integrated circuit die with a scribe seal and a crack arrest structure with an opening in a passivation layer. A semiconductor wafer includes a plurality of scribe streets arranged in rows and columns on the surface of the semiconductor wafer; a plurality of integrated circuit dies arranged in rows and columns and spaced apart by the scribe streets. Each of the integrated circuit dies includes: a plurality of active areas formed in a portion of the semiconductor wafer; a plurality of insulator layers overlying the active areas and the semiconductor wafer; a plurality of conductor layers overlying the semiconductor wafer, the conductor layers interspersed with and separated by ones of the insulator layers; a plurality of conductive vias extending vertically between the active areas and one of the conductor layers, and additional conductive vias extending vertically between and coupling ones of the conductor layers; and a passivation layer overlying a top portion of the uppermost one of the conductor layers. The integrated circuit dies include a scribe seal surrounding the periphery of the integrated circuit die. The scribe seal has the plurality of conductor layers and conductive vias extending through the insulator layers between the conductor layers, the scribe seal forming a vertical conductor structure which surrounds the integrated circuit die at the periphery, the scribe seal covered by the passivation layer. The integrated circuit dies also include a crack arrest structure overlying the semiconductor wafer located surrounding and spaced from the scribe seal, the crack arrest structure having the plurality of conductor layers and having conductive vias extending through the insulator layers between the conductor layers, the crack arrest structure forming a vertical conductor structure that surrounds the scribe seal in the scribe seal region, and including an opening in the passivation layer that extends to and exposes the upper surface of the uppermost one of the plurality of conductors in the crack arrest structure.

DETAILED DESCRIPTION OF EXAMPLE EMBODIMENTS

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

The term "scribe street" includes similar terms such as "scribe lane" and "scribe line" and refers to areas on a semiconductor wafer between adjacent integrated circuit dies that are set aside for physically separating the integrated circuit dies. In a mechanical sawing operation, a saw kerf lane is positioned centrally in the scribe street. The laser or saw blade traverses the saw kerf lane during singulation. The material in the saw kerf lane is destroyed during the mechanical sawing operation and is then lost. In a mechanical sawing operation, the saw kerf lane is somewhat wider than the width of the saw blade, as the saw blade vibrates and wobbles during sawing and removes material to a width that is wider than the saw blade.

Figure 1:
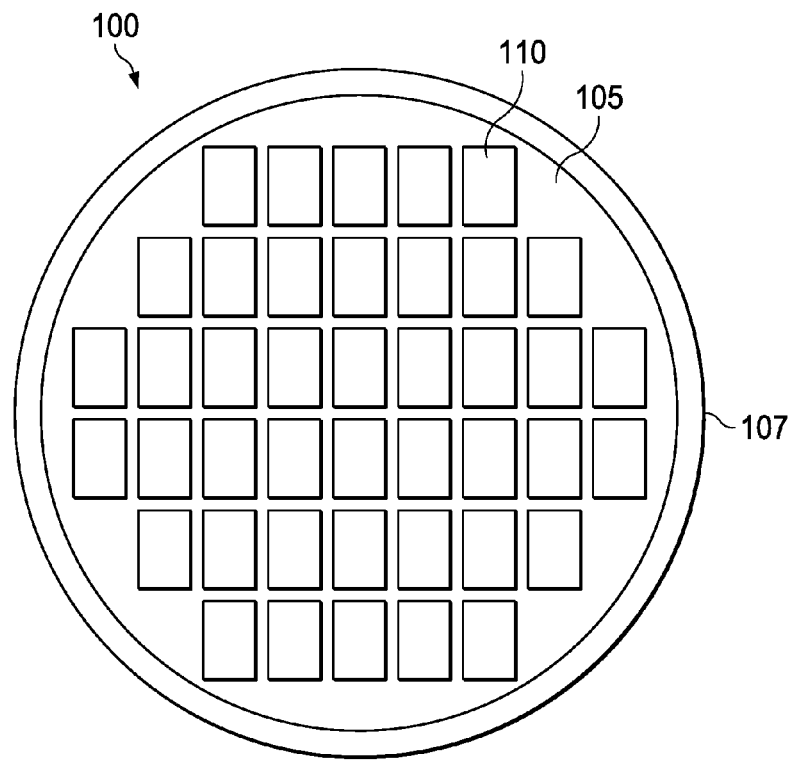
FIG. 1 illustrates a semiconductor wafer and integrated circuit dies.

FIG. 1 depicts in a plan view 100 a semiconductor wafer 105 having a plurality of integrated circuit dies 110 formed on the semiconductor wafer 105. The semiconductor wafer is shown arranged on a wafer support or frame 107. Not visible in this view is a supporting backing material referred to as "dicing tape" which lies beneath and is adhered to the semiconductor wafer 105. During a dicing operation the dicing tape supports and stabilizes the integrated circuit dies 110. As the semiconductor wafer is cut or sawed through, the integrated circuit dies remain in position, are physically supported by the wafer dicing tape, and don't fall away from the support 107. Pick and place or other die handling equipment can then be used to remove the dies from the wafer dicing tape after the integrated circuit dies have been sawed apart. The integrated circuit dies 110 are then processed further and eventually are packaged to form completed integrated circuit devices.

Each of the integrated circuit dies 110 can include active devices such as transistors, diodes and similar devices formed on the semiconductor substrate 105. The active devices are formed in active areas of the semiconductor substrate. Active areas are areas formed using ion implantation and impurity doping techniques to become p type and n type doped areas. These p type and n type doped areas can be used to form: transistors such as bipolar transistors, metal oxide semiconductor (MOS) field effect transistors (MOSFETs); diodes; silicon controlled rectifiers; and other devices that conduct current in response to a voltage or current. Passive devices can be formed on the semiconductor wafer, including: capacitors; resistors; and inductors. The passive devices can be formed either using the substrate material or in layers formed over the substrate. Sensors such as fluxgate sensors, current sensors, photosensors, temperature sensors, pressure and other sensors can be formed using the active areas and the layers formed over the substrate. In an example a fluxgate sensor is formed within the integrated circuit dies. When completed, the integrated circuit dies 110 each form a complete circuit that performs a desired function. The circuit is formed by coupling the transistors, resistors, capacitors, diodes, sensors etc. together and to input terminals for receiving signals and power, and the integrated circuit dies 110 also have output terminals for outputting signals. The integrated circuit dies 110 can form circuits such as: transistors; digital circuits such as logic gates; analog circuits such as rectifiers; controllers such as microcontrollers; processors such as digital signal processors or central processing units; non-volatile storage devices such as FLASH devices; memory devices such as static random access memory (SRAM) devices or dynamic random access memory (DRAM) devices; integrated sensor devices, or other integrated circuit devices. Each of the integrated circuit dies 110 on a semiconductor wafer 105 can be an identical integrated circuit. Integrated circuits can include a few, many thousands, or even millions of devices.

Figure 2:
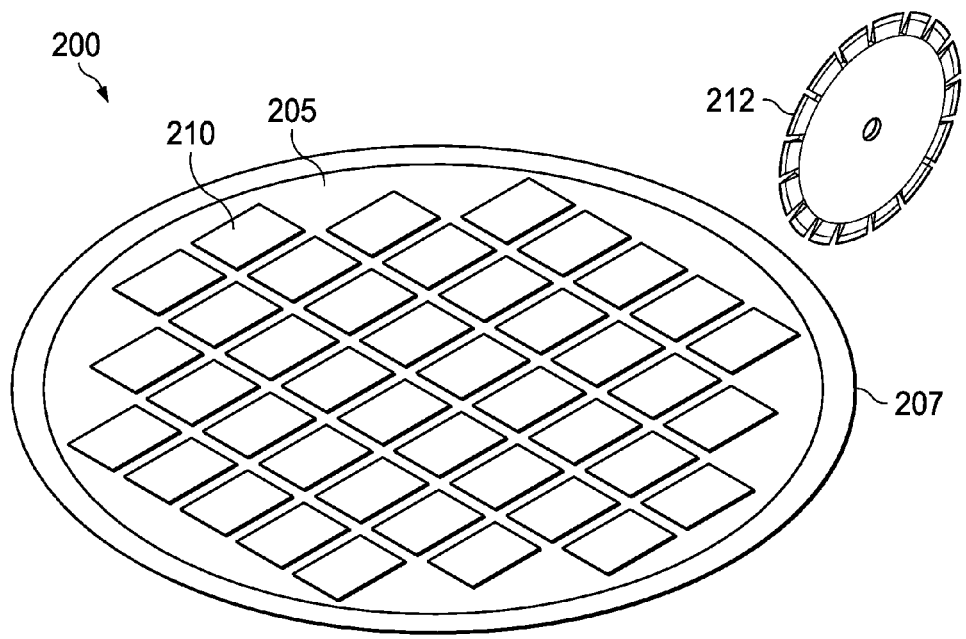
FIG. 2 illustrates a semiconductor wafer and a wafer dicing saw.

FIG. 2 illustrates in another plan view 200 a semiconductor wafer 205 shown in a mechanical sawing operation. In FIG. 2, similar reference labels are used for those elements that correspond to the elements of FIG. 1, except that the reference labels begin with the digit "2" in FIG. 2, for convenience. In FIG. 2, semiconductor wafer 205 is shown including a number of integrated circuit dies 210. A support 207 provides mechanical support for the semiconductor wafer 205. A saw blade 212 is shown being applied to the top surface of the semiconductor wafer 205. The saw blade 212 will saw through the semiconductor wafer 205 in defined saw kerf lanes that are positioned in scribe streets between the integrated circuit dies 210. The saw kerf lanes of the scribe streets are areas that will be removed during the sawing operation and so any circuitry positioned there will be destroyed. Test circuitry and certain structures that can be used to characterize the material properties of the semiconductor wafer prior to dicing can be formed in the scribe streets. After dicing is completed, these test structures are no longer available.

Figure 3:
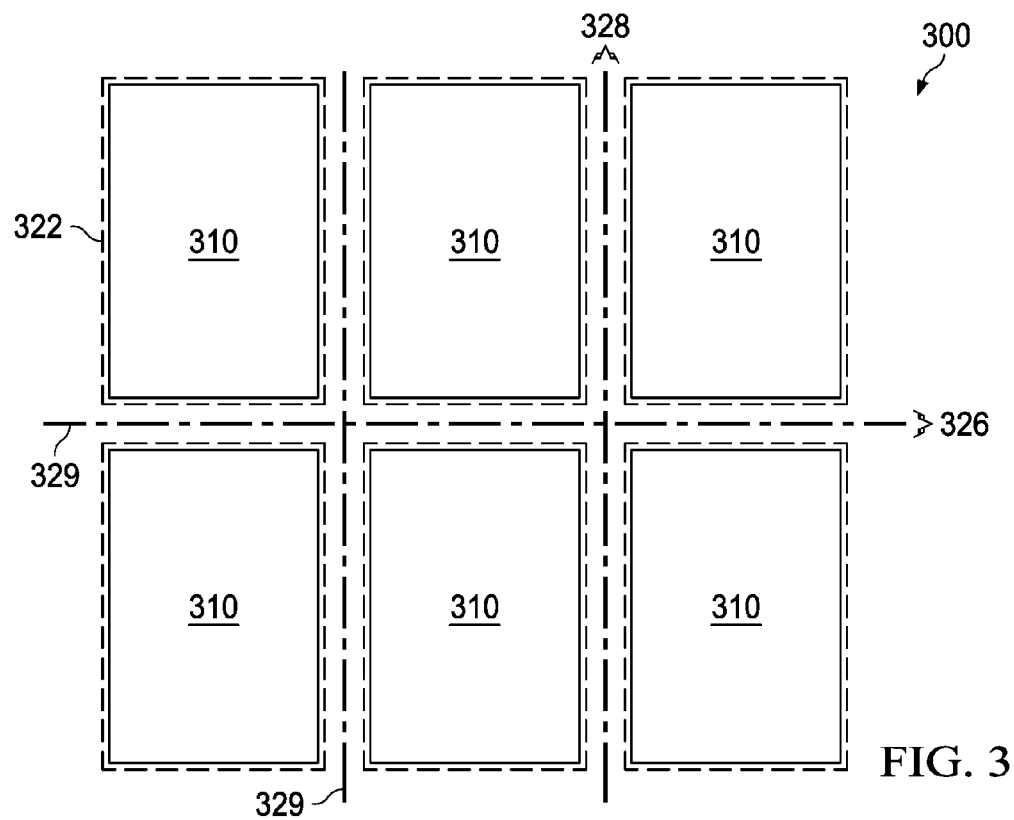
FIG. 3 illustrates in a plan view a portion of a conventional semiconductor wafer and integrated circuit dies with scribe seals.

FIG. 3 depicts in a plan view 300 a portion of a conventional semiconductor wafer having a number of integrated circuit dies 310 formed on it. Areas 326 and 328 are scribe streets including saw kerf lanes for sawing the integrated circuit dies 310 apart in a dicing operation. The scribe streets have a width which can vary from about 40 microns to over 100 microns. Using less area of the semiconductor wafer for the scribe street areas is desired, because using a lower area for the scribe street areas leaves more semiconductor wafer area for forming additional integrated circuit dies, lowering the cost per integrated circuit. Kerf lanes 329 are shown in the central portion of the scribe streets 326 and 328 and these kerf lanes identify the places where the saw will cut through the insulator layers and the conductor layers overlying the semiconductor wafer. The saw will also cut through the semiconductor wafer entirely to separate the integrated circuit dies from one another.

In FIG. 3, each integrated circuit die 310 is surrounded by a conventional scribe seal 322. The scribe seal includes the insulator layers and the conductor layers that are also used in forming the insulators and conductors within the integrated circuit dies 310. The conductor layers of the scribe seal are formed simultaneously with the integrated circuit conductor layers. The insulator layers that lie between and around the conductor layers within the integrated circuit dies 310 are also formed in the scribe seal 322. The scribe seals are arranged between the scribe streets 326 and the integrated circuit dies 310, and the scribe seals surround the integrated dies 310. The scribe seals 322 are intended to reduce or prevent cracks formed in the insulator layers during dicing in the scribe streets 326, 328 during sawing or scribing from propagating into the integrated circuit dies 310. The propagation of cracks that begins during the dicing operation is addressed by forming metal structures that extend vertically through and interrupt the continuity of the brittle insulator layers. By interrupting the insulator layers, the scribe seal is arranged to prevent or to stop a crack from traversing the scribe seal structure. However, experience has shown that cracks can still breach the scribe seals of FIG. 3.

The semiconductor wafer can be of any one of several known semiconductor materials including silicon, gallium, gallium arsenide, silicon germanium, and other III-V compounds. These materials are all fairly brittle. The conductor layers can include aluminum and its alloys, and copper and its alloys, as well as other conductive material such as doped polysilicon.

The insulator layers can be any of the insulator and dielectric materials used in semiconductor processing, including: silicon dioxide, silicon nitride, silicon oxynitride, silicon carbide, doped glass such as boron-silicate glass, phosphor silicate glass, undoped silicate glass, fluoro-silicate glass, tetraethylortho-silicate oxide (TEOS), and silicon containing hydrogen silsesquioxane. Gels and organics can be used as insulators, such as polyimides, organic polymerics, and foams. These insulator layers extend into the scribe streets and can crack during dicing. Cracks that form in these layers can propagate within the layer and extend into integrated circuit dies on the semiconductor wafer.

The mechanical sawing operations use a saw blade that is made of steel or titanium alloys with diamond material at the cutting surface. When the semiconductor wafers are cut, a portion of the scribe street material remains with the integrated circuit dies including the scribe seal area.

Figure 4:
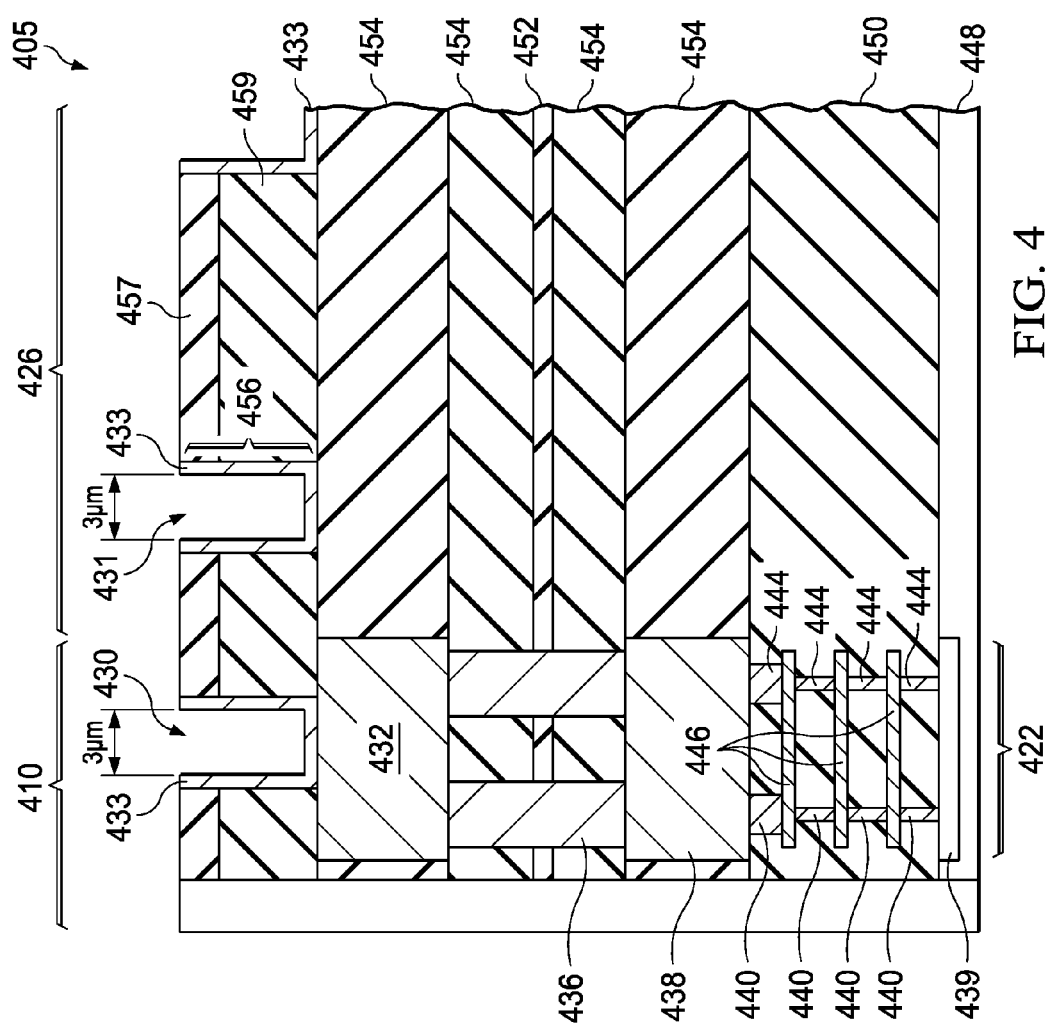
FIG. 4 illustrates in a cross sectional view a portion of a semiconductor wafer and a conventional scribe seal.

FIG. 4 depicts in a cross sectional view a portion of a semiconductor wafer 405 including a conventional scribe seal 422. The scribe seal 422 is an example such as the one shown in the plan view of FIG. 3. In FIG. 4, those areas that correspond to areas in FIG. 3 are shown with similar reference labels, except that the first digit is now a "4" in FIG. 4, for convenience. In FIG. 4, one side of an integrated circuit die 410 and the corresponding scribe street 426 are shown. The scribe seal 422 is shown as a structure of conductor layers formed in and interspersed with the insulating layers and extending from the semiconductor wafer 448 up to a passivation layer 456. An active area 439 is shown in the semiconductor wafer 448. This active area will be formed simultaneously with the formation of active areas for the circuits within integrated circuit 410. In an example arrangement, the active area 439 can be coupled to an electrical potential such as a ground potential to add electrical stability to the scribe seal 422. In other example arrangements the active area 439 may be left floating.

The scribe seal 422 is formed simultaneously with and using the same insulator layers and conductor layers used in the formation of devices within the integrated circuit die 410. In FIG. 4, the lower level conductors 446 can be, for example, aluminum. Other metals and alloys can also be used. Aluminum has good adherence to insulators such as silicon oxides that are commonly used for the insulator layers, and has good conductivity/resistance, and is of low cost to manufacture. The various insulator layers are sometimes referred to by different terms depending on the application and position in the semiconductor substrate. For example, insulator material formed over the active area and prior to any metallization steps can be called "pre-metal dielectric" or "PMD." Insulator layers that are formed surrounding metal layers can be called "inter-level dielectric" or "ILD." Insulator layers that are formed between layers of conductors can be referred to as "inter-metal dielectric" layers or "IMD." Trench vias 440 are shown vertically stacked over and in contact with the active area 439. For purposes of this application, the term "via" includes the opening formed in an insulator layer and also the conductive material that fills the opening to form a vertical physical and electrical connection. In the scribe seal 422, trench vias 440 are used in the portion of the scribe seal closest to the integrated circuit die. The trench vias 440 and the conductor layers they couple together thus form a continuous wall of conductor material that interrupts each of the insulation layers 450, 452, and 454. The use of the scribe seal 422 is an attempt to stop any crack propagating within an insulation layer from the scribe street area 426 from continuing into the integrated circuit die area 410.

The lower level metal layers 446 can be formed of a metal used in semiconductor processes for forming conductors in the "front end of the line" processes. For example, metal layers 446 can be formed of aluminum and aluminum alloys. Aluminum conductors in semiconductor devices can be formed using photolithography, including photoresist deposition, photoresist exposure, photoresist patterning, and etch methods. The trench vias 440 can be formed using conductive via materials typically used in semiconductor processes such as tungsten and its alloys. Other conductive materials can be used. Vias 444 can be formed using "stitch" vias. These stitch vias do not form a continuous wall but instead are formed as a number of individual columns that can be round, square or oval shaped and extending through the insulation layers 450. The stitch vias provide physical support and electrical connections to the aluminum conductive layers 446.

The insulation layers 450, 452 and 454 are formed using conventional semiconductor processes for dielectrics. These layers can be formed using chemical vapor deposition (CVD), plasma enhanced chemical vapor deposition (PECVD) and can be thermally grown. Tetraethyl orthosilicate (TEOS) can also be used. Typically the insulator layers 450, 452, 454 will include oxide layers and nitride layers in different portions, so that selective etching processes can be used. Etch stop layers can be formed in addition to and between the layers visible in FIG. 4. For example, layer 452 can be a silicon nitride etch stop layer. Additional films and layers can be included to: assist in etch processing; aid in adhesion; provide barrier layers; provide anti-reflective coatings; and provide backside anti-reflective coatings to improve photolithographic processes. The materials used for the insulator layers can include, without limitation: silicon oxide, silicon nitride, silicon carbide, silicon oxynitride, SiOC, and other films and gel dielectrics. High-k and low-k dielectrics can be included.

In FIG. 4, the scribe seal 422 also includes upper level metal conductors. These can be formed in the "back end of the line" or "BEOL" processes. Copper conductors are used to form upper level metal conductor layers in many semiconductor processes. Copper has a lower resistance than aluminum and may be less prone to electromigration problems. Copper conductors can increase device performance in integrated circuits. Processing copper conductor layers is quite different from processing aluminum layers. Diffusion barrier materials surround the copper on all sides to prevent copper ion diffusion. In FIG. 4, the scribe seal 422 includes a first copper conductor 438 and a second copper conductor 432 that is the uppermost conductor layer. In various example semiconductor processes, more or fewer conductor layers can be used, including more or fewer lower level conductor layers and more or fewer upper level conductor layers. In FIG. 4, the copper conductor layers can be formed using damascene processes in the BEOL processing. In damascene processes, the copper is not patterned and etched as the aluminum lower level conductors were. Instead, a metal inlay procedure is used. The insulator layers are patterned to form trenches. Copper seed layer material is sputtered or otherwise deposited. An electroplating process is performed to fill the trench and to ensure complete filling of the trench, the electroplating continues above the surface of the trench. After the electroplating is finished with an "overburden" layer above the surface of the trenches, chemical mechanical processing or "CMP" is performed to complete the conductor layer and to planarize the upper surface of the layer.

In CMP, a chemically active slurry is applied to a polishing pad. The slurry includes abrasive particles. The surface of the wafer with the excess material is applied to the pad in a circular or other motion, and the excess copper material is polished away leaving a planar trench filled with the planarized copper conductor. Additional dielectric layers are formed and vias can be formed between the conductor layers using etch and etch stopping layers of dielectric material. The vias and overlying trenches can be filled using the electroplating process. In this manner several layers of upper level conductors can be formed.

In the scribe seal 422, the uppermost conductor layer 432 is vertically connected to the layer 438 by a trench via 436. This trench via is formed on the side of the scribe seal closest to the integrated circuit die and continues the vertical wall that is formed interrupting the insulation layers. In FIG. 4 an etch stop layer 452 is shown between the upper level insulator layers 454 and the lower insulator layers 450. However, this is but one example arrangement and the insulator layers 454, 450 and 452 can be formed of similar materials or of different materials as described above.

The scribe seal 422 of FIG. 4 also includes an opening 430 formed in a passivation layer 456. The passivation layer overlies the upper surface of the uppermost conductor layer 432 and can be formed of silicon oxide, silicon nitride, silicon oxynitride and other dielectric materials. In FIG. 4, the uppermost layer of the passivation layer 457 is shown as silicon nitride. The remainder of the passivation layer 459 can be silicon dioxide. The passivation layer 456 forms a protective layer, electrically insulating the conductors and also provides a physical coating to protect the metal conductors and the semiconductor substrate from corrosive elements and moisture.

In FIG. 4, the opening 430 in the passivation layer 456 is intended to prevent a crack in the passivation layer 456 from propagating from the scribe street area into the integrated circuit die 410 by interrupting the passivation layer vertically. However, when devices have cracks in an insulator layer that touch the seal 422, the material is considered scrap. An additional opening 431 is shown in the passivation layer 456 within scribe street 426.

The openings 430, 431 are shown with a thin film of conductive material 433 which can be an adhesion layer and a diffusion barrier. The liner material is conductive and forms a coating on bond pads for the integrated circuit. In one example a titanium palladium alloy Ti/Pd was formed. In additional examples the material 433 can be tantalum, tantalum nitride, nickel, palladium, or TaN/Ni/Pd. Various other metals and alloys can be used in different combinations to reduce pitting and corrosion of the bond pads. The material 433 is deposited into the openings 430, 431, and over the passivation layer. The excess liner material is then removed using CMP to expose the upper surface of the passivation layer 456, leaving the liner material 433 to make further electrical contact to the upper conductor 432.

In prior art scribe street structures, the scribe street may be opened to remove the passivation layer across the scribe street; however, this extra opening can cause shorting of parametric test structures that are placed in the scribe street for electrical process monitoring. This approach is not compatible with some semiconductor processes.

The passivation opening 430 in the conventional scribe seal 422 can increase a metal corrosion risk. The liner material 433 formed inside the opening 430 has to be deposited into corners of an opening that are just over the top surface of copper conductor 432. Because the corners of the opening may not be completely filled in all cases, any unfilled portion of the corner can lead to a path for moisture or other contaminants to reach the copper surface, starting corrosion or otherwise reacting with the copper. If moisture should intrude into this area, the risk that the passivation layer 456 will suffer delamination increases.

In the conventional scribe seal 422 of FIG. 4, the passivation openings 430 and 431 are less than 5 microns and may be about 1.5 microns in an example process. The use of the CMP processes after these openings 430, 431 in the passivation layer 456 are formed can lead to undesirable trapping of slurry or particles. The slurry or particles and excess material that is produced during CMP can get trapped in these openings and due to the small size of these openings, this unwanted material can be very difficult to dislodge or clean. Even after post CMP cleaning, these openings can trap particles that pose risks of contamination or defects in the finished integrated circuit.

In addition, when a semiconductor wafer formed using the conventional scribe seal 422 of FIG. 4 is diced using a mechanical saw, significant crack propagation was observed, resulting in loss of integrated circuit dies due to cracks in the insulator layers within the devices.

Figure 5:
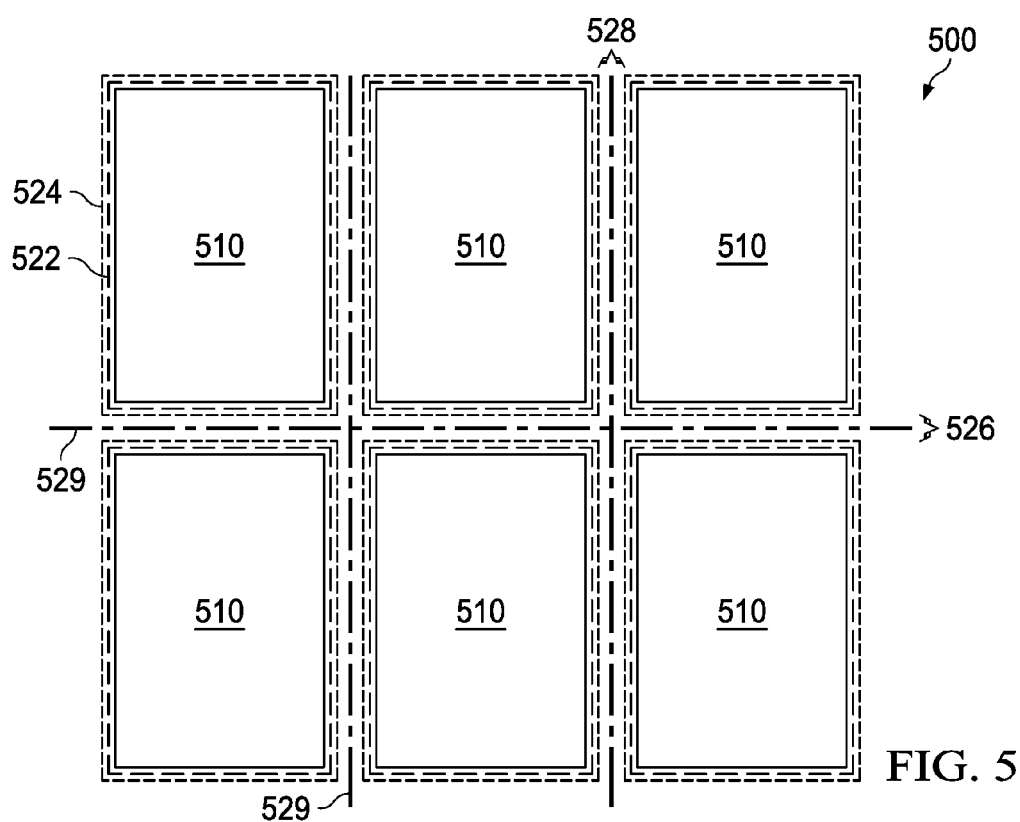
FIG. 5 illustrates in a plan view a semiconductor wafer incorporating a scribe seal and crack arrest structure in an embodiment.

FIG. 5 illustrates in a plan view 500 a portion of a semiconductor wafer incorporating an embodiment. In FIG. 5, for those elements that correspond to elements in FIGS. 3 and 4, similar reference labels are used. However the first digit in the reference label is now a "5" for convenience.

In FIG. 5, a plurality of integrated circuit dies 510 are formed on the surface of a semiconductor wafer. The integrated circuit dies are arranged in rows and columns and spaced by scribe streets. Scribe street 526 is shown in a horizontal orientation, while scribe street 528 is shown in a vertical orientation. Note that these are relative positions, as the semiconductor wafer portion in view 500 can be rotated. A saw kerf line 529 is shown in a central portion of each scribe street.

In FIG. 5, each integrated circuit die 510 includes a scribe seal 522 and a crack arrest structure 524. The scribe seals 522 surround each integrated circuit die and are placed between the scribe street and the interior of the integrated circuit dies and extends around the periphery of the integrated circuit dies 510. The crack arrest structures 524 also surround each integrated circuit die 510 and are positioned outside the scribe seal 522 for each integrated circuit die 510. The crack arrest structures 524 are positioned between the scribe seal and the scribe streets and form a periphery around the scribe seal 522 for each integrated circuit die 510. The crack arrest structures 524 are added to provide additional crack prevention. The crack arrest structures prevent cracks in the insulator or passivation layers from propagating from the scribe streets into the integrated circuit dies 510.

Figure 6:
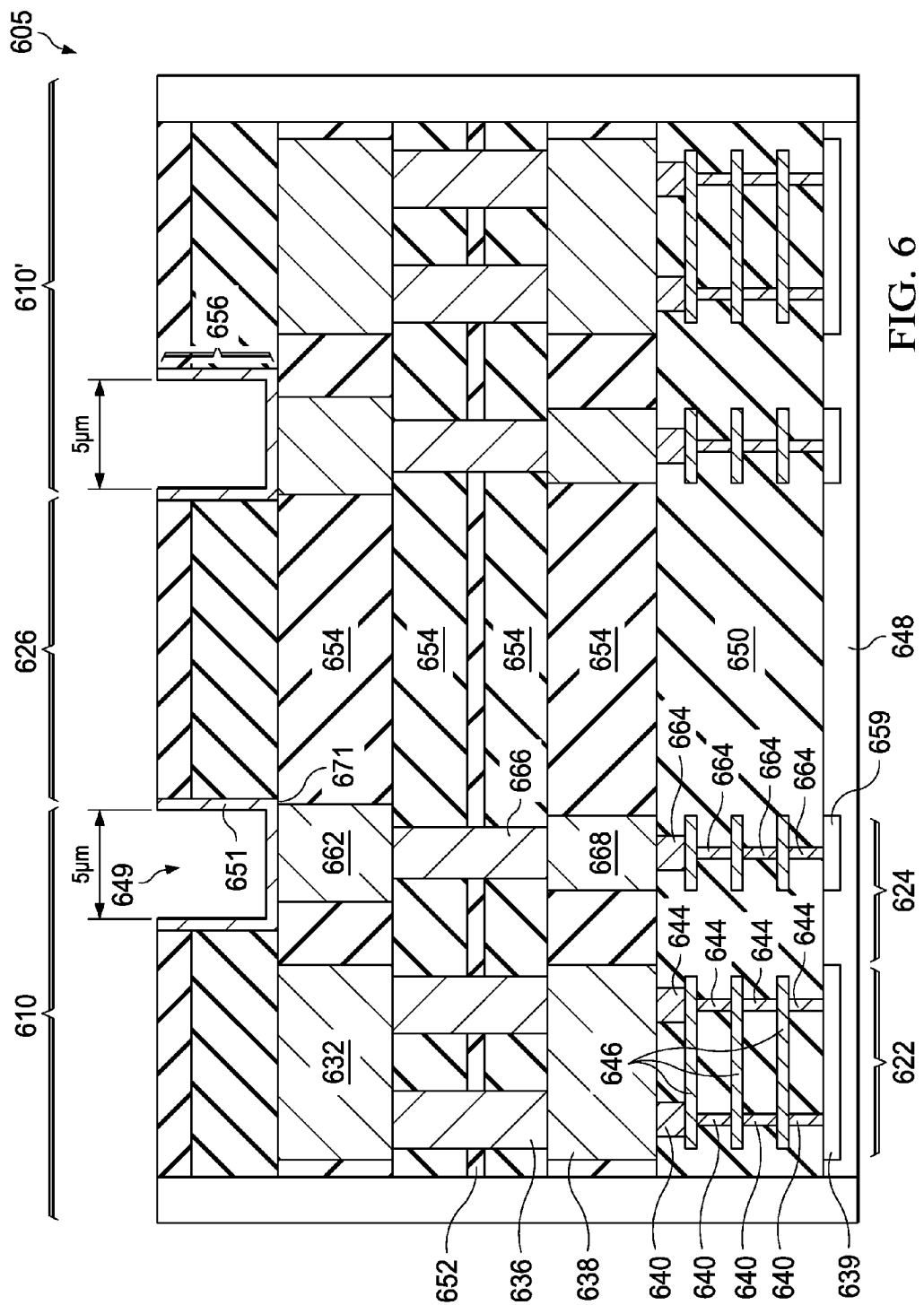
FIG. 6 illustrates in a cross sectional view a portion of a semiconductor wafer and a scribe seal and crack arrest structure of an embodiment.

FIG. 6 illustrates in a cross sectional view a portion of a semiconductor wafer 605 incorporating a crack arrest structure and scribe seal of the embodiment of FIG. 5. In FIG. 6, for those elements that correspond to similar elements in FIGS. 3-5, similar reference labels are used. However, in FIG. 6 the first digit in the reference labels is now "6," for convenience.

In FIG. 6, one side of an example integrated circuit die 610 is shown at the left side of the figure, adjacent a scribe street 626, and a second example integrated circuit die 610' is shown at the right side of FIG. 6, so that the two integrated circuit dies 610, 610' are spaced apart and separated by the scribe street 626.

In FIG. 6, a scribe seal 622 is shown positioned adjacent the edge of the integrated circuit die interior and a crack arrest structure 624 is positioned between the scribe seal 622 and the scribe street 626. The crack arrest structure 624 forms a vertical wall of conductor material that increases crack protection by interrupting the insulator layers 650, 652, 654 to prevent cracks formed in these layers in the scribe street area from propagating to the scribe seal 622.

Scribe seal 622 is similar to the scribe seal 422 shown in FIG. 4. The scribe seal 622 extends vertically from an active area 639 in the surface of the semiconductor wafer upwards to the passivation layer 656. The scribe seal 622 includes the lower level conductor layers 646 and trench vias 640 extending through the insulation layers 650. The scribe seal 622 further includes the upper level conductor layers 638, 632 and trench vias 636. The trench vias 636 are continuous vertical conductors formed between the conductor layers 632, 638 and physically and electrically coupling the conductor layers. The combination of the trench vias 640, 636 with the lower level conductor layers 646 and the upper level conductor layers 638, 632 forms a continuous metal interruption in the insulation layers 650, 652 and 654 adjacent to the interior of the integrated circuit die 610. Stitch vias 644 further provide mechanical support for the lower level conductor layers 646.

In FIG. 6, an additional crack prevention structure crack arrest structure 624 is added to eliminate or further reduce the likelihood of any crack in an insulator layer propagating from the scribe street to the integrated circuit dies. The crack arrest structure 624 is formed from the same conductor layers and at the same time as the scribe seal 622, and the conductor layers are formed simultaneously with the conductor layers used in the integrated circuit die 610.

Crack arrest structure 624 is spaced from the scribe seal 622 by a distance D1 and is placed between the scribe street 626 and the scribe seal 622. The crack arrest structure 624 forms a vertical wall around the scribe seal, which surrounds the periphery of the integrated circuit dies. The crack arrest structure 624 forms a second peripheral ring around the integrated circuit dies. In an example, the spacing D1 was about 3 microns. Other spacings can be used.

The crack arrest structure 624 includes trench vias 664 and lower level conductor layers 646. The trench vias are filled with conductive material used for via plugs, such as tungsten or tungsten alloys. The combination of the trench vias 664 and the lower level conductor layers forms a continuous interruption in the insulator layers 650 between the scribe street and the scribe seal 622. In this manner, a crack that begins in the scribe street due to a sawing operation is prevented from propagating through the insulator layers to the scribe seal 622. The upper level conductors 668, 662 are formed of the same material and at the same time as the upper level conductors 638, 632 in the scribe seal and these conductors are also formed at the same time as the upper level conductors used in the integrated circuit dies 610.

Crack arrest structure 624 includes via trench 666 between the upper level conductor layers 662, 668. The crack arrest structure 624 forms a continuous vertical interruption in the insulator layers from the surface of the semiconductor substrate at active area 659 up through the insulator layers 650. 652 and 654 up to the bottom of the passivation layer 656.

An opening 649 is formed over the crack arrest structure 624 in the passivation layer 656. Importantly, the opening is wider than the width of the upper surface of the uppermost conductor layer. The greater width of the opening 649 places the corners of the opening 649 in the passivation layer away from the upper surface of the uppermost conductor layer 662. In an example the upper conductor layers 668, 662 are formed using damascene copper processes. Corrosion risk is reduced because any fill problems that occur in forming the TaN/Ni/Pd layer 651 in the passivation opening 649 will not expose the copper surface of the uppermost conductor layer 662 to moisture or contaminants.

The opening 649 is completed by depositing the conductive liner 651 using TaN/Ni/Pd, Ti/Pd, or other conductor materials to form a barrier layer and an electrical contact for connection in areas of the integrated circuit 610 such as bonding pads. Multiple layers of conductors can be used to form conductive liner 651. Examples include using various layers of nickel, gold, and palladium such as electroless nickel immersion gold ("ENIG") and electroless nickel, electroless palladium, immersion gold ("ENEPIG") plating systems. Use of layers of conductors can reduce or eliminate corrosion and pitting by preventing diffusion of mobile ions, such as copper and nickel, to the surface. In an example the conductive liner 651 is sputter deposited over the passivation layer 656. After deposition the conductive material lines the openings in the passivation layer and it also coats the upper surface of the passivation layer. CMP is then used to remove the excess conductor material. Particles from the CMP can fall into the openings 649 and then must be cleaned away.

Reference label 671 indicates an overlap portion of the opening 649 beyond the edge of the upper surface of the uppermost conductor layer 662. In an example arrangement, the width of the opening 649 in the passivation layer 656 is greater than about 5 microns. The width of the upper surface of the uppermost conductor 662 in the same arrangement is about 3 microns. In this example the overlap distance 671 is at least about 1 micron on each end of the passivation opening 649.

As described above, the passivation layer openings in the conventional scribe seal 422 of FIG. 4 were less than 5 microns wide. In the embodiment of FIG. 6, the openings in the passivation layer are greater than about 5 microns. The use of these larger openings has been found to reduce the amount of CMP slurry or particles that become trapped in the openings due to CMP processes performed on the surface of the passivation layer. Use of openings in the passivation layer that are even larger is also contemplated and beneficial, as removal of any slurry particles that get trapped in the openings is easier to accomplish than for the smaller openings in the conventional scribe seal.

In the particular embodiment of FIG. 6, no opening in the passivation layer 656 is formed over the scribe seal 622. By not forming an opening over the scribe seal 622, a corrosion risk is eliminated. This is important because in some arrangements, the conductors in the scribe seal are coupled to other portions of the integrated circuit, so that corrosion in the scribe seal conductors can affect the completed integrated circuits.

Figure 7:
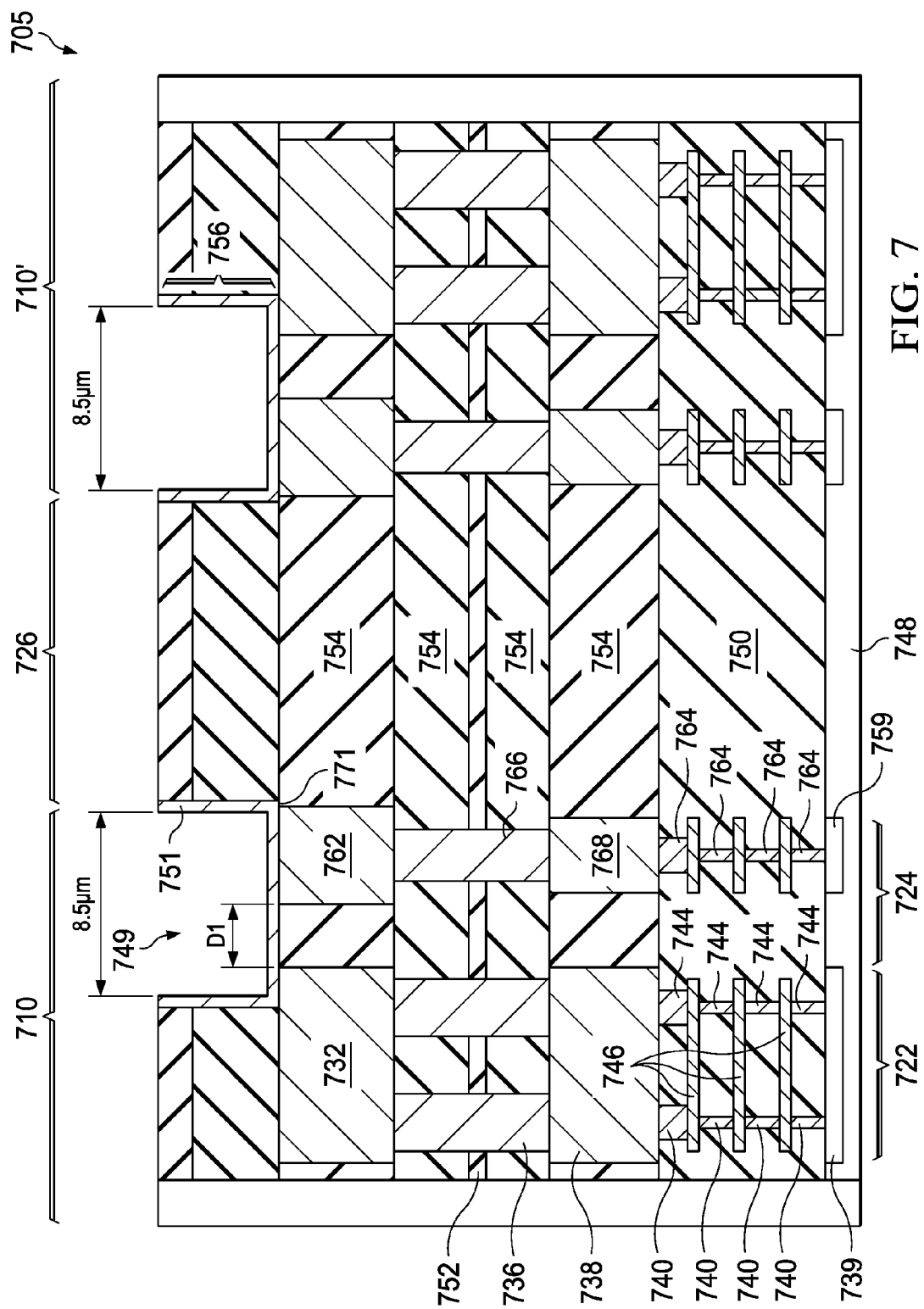
FIG. 7 illustrates in a cross sectional view a portion of a semiconductor wafer and a scribe seal and crack arrest structure of another embodiment.

FIG. 7 illustrates in another cross sectional view a portion of a semiconductor wafer 705 incorporating another embodiment. In FIG. 7, the reference labels for elements that correspond to the elements in FIG. 6 are similar, however in FIG. 7 the first digit is "7" for convenience. In FIG. 7, a crack arrest structure 724 is shown spaced from a scribe seal 722 in the periphery of integrated circuit die 710. The integrated circuit dies 710 and 710' are shown spaced apart and separated from one another by a scribe street 726. The scribe seal 722 includes vertical structures that form a wall surrounding the interior of integrated circuit 710. The scribe seal 722 extends from an active area 739 formed in the surface of the semiconductor substrate 748. Trench vias 740 and lower level conductors 746 are coupled to upper level conductor layer 738. Trench vias 736 vertically connect the upper level conductor 732 to the conductor layer 738. The scribe seal 722 interrupts the insulator layers 750, 752 and 754 to prevent cracks from propagating from the scribe street 726 to the integrated circuit die 710.

Crack arrest structure 724 is arranged spaced from the scribe seal 722 by a distance D1 and surrounds the scribe seal 722. The crack arrest structure 724 extends vertically from the active area 759 in the semiconductor substrate 748 to the passivation layer 756. The crack arrest structure 724 includes vias 764 that are vertical trench vias between the lower level conductor layers 746, and an upper level conductor 768, a trench via 766, and the uppermost upper level conductor layer 762.

An opening 749 is formed in the passivation layer 756 that exposes the upper surface of the uppermost upper level conductor 762. This opening 749 continues towards the integrated circuit die and extends to expose a portion of the uppermost upper level conductor 732 that forms the top metal of the scribe seal 722. The opening 730 in the passivation layer 756 has a width that is greater than about 8 microns. In the illustrative example of FIG. 7, the width is 8.5 microns. The opening 749 in the passivation layer 756 prevents cracks in this layer that start in the scribe street area 726 from propagating to the integrated circuit die 710. The opening in the passivation layer is expanded when compared to the embodiment of FIG. 6. This larger opening further reduces the likelihood that particles that result from the CMP processing of the passivation layer 756 will be trapped in the openings 749 in the passivation layer.

While the opening 749 exposes a portion of the upper surface of the uppermost conductor in the scribe seal 722, the remainder of the upper surface of the uppermost conductor 732 is covered by the passivation layers 756, reducing the probability of corrosion and delamination of the upper conductor 732. In an example, the width of conductor 732 that remains covered by the passivation layer 756 was greater than about 4 microns. The overlap of passivation material 756 and conductor 732 is important to reduce the probability of corrosion.

Figure 8:
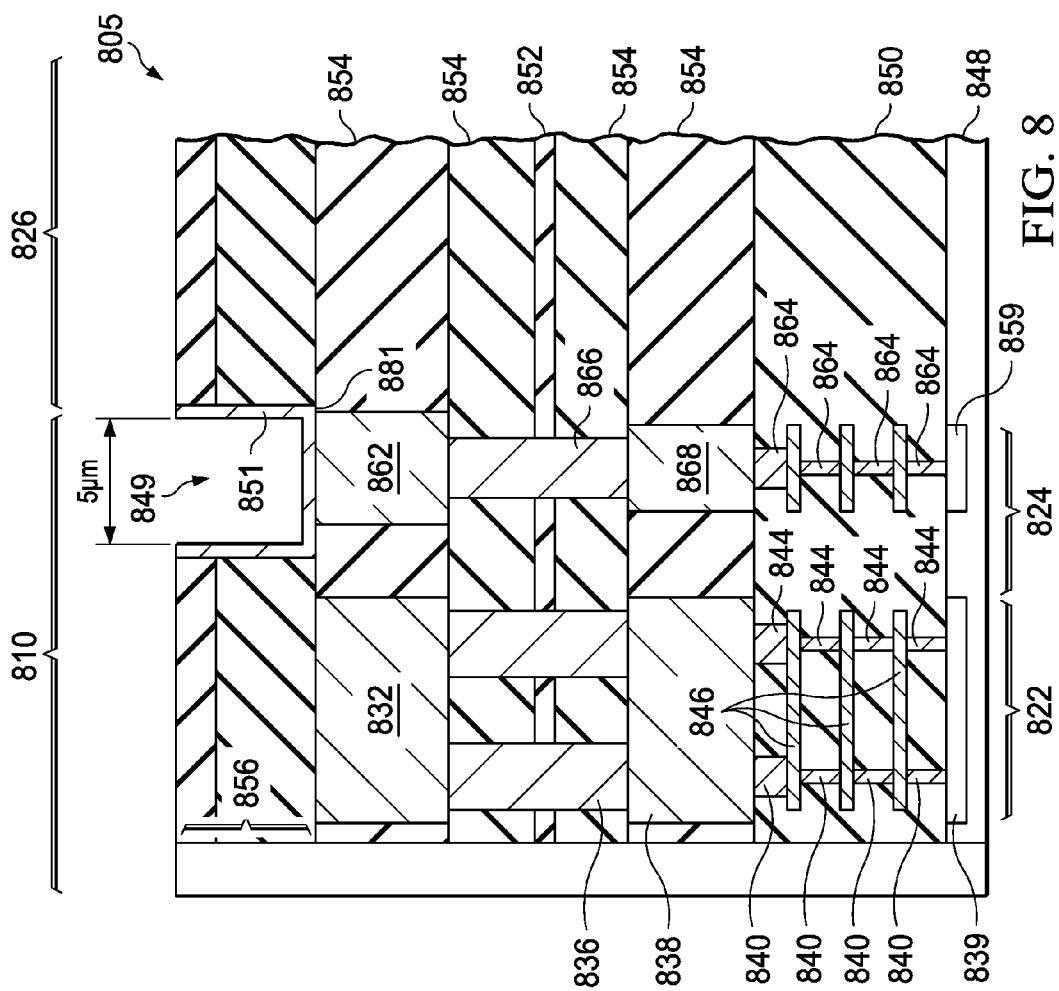
FIG. 8 illustrates in another cross sectional view a portion of an integrated circuit and a scribe seal after a dicing operation.

FIG. 8 depicts in another cross sectional view 805 a portion of a single integrated circuit 810 formed after a dicing operation in a scribe street area. In FIG. 8, the jagged line 806 illustrates the outside edge of the integrated circuit following a dicing operation. The integrated circuit 810 and the remaining portion of the scribe street 826 are shown after the dicing operation. The remaining elements of FIG. 8 are arranged as shown in FIG. 6 for the integrated circuit 610. Elements that correspond to the elements of FIG. 6 that are also shown in FIG. 8 have similar reference labels, except that the first digit is now replaced with the digit "8" for convenience.

In FIG. 8, the scribe seal 822, including the active area 839, the trench vias 840, the lower level conductor layers 846, the stitched vias 844, the insulator layers 850, the upper level conductor layers 838, 832, the trench via 836, is arranged as shown in FIG. 6. The passivation layer 856 is shown overlying the uppermost one of the upper conductors 832 in the scribe seal 822. Scribe seal 822 surrounds the integrated circuit die 810 and the vertical conductors and vias in scribe seal 822 interrupt the insulator layers 850, 852, 854 to prevent propagation of cracks from the scribe street area into the integrated circuit die 810. Crack arrest structure 824 is arranged in the same manner as the crack arrest structure 624 in FIG. 6.

In FIG. 8, crack arrest structure 824 includes the trench vias 864, the lower level conductor layers 846, the upper conductor layers 868, 862 and the trench via 866 to form a continuous vertical wall that interrupts each of the insulator layers 850, 852, 854 to prevent the propagation of cracks from the scribe street 826 into the integrated circuit die 810. The opening 849 in the passivation layer 856 lands on and exposes the upper surface of the uppermost conductor layer 862 in the crack arrest structure. The crack arrest structure 824 surrounds and provides a second protection structure that prevents cracks that begin in the scribe street 826 from propagating into the integrated circuit die 810. The opening 849 in the passivation layer 856 prevents cracks in this layer from propagating into the integrated circuit die 810. Because this opening is greater than about 5 microns wide, slurry and particles that fall into this opening during CMP processing are easily removed by cleaning and do not remain or are greatly reduced after CMP processing of the passivation layer 856.

Figure 9:
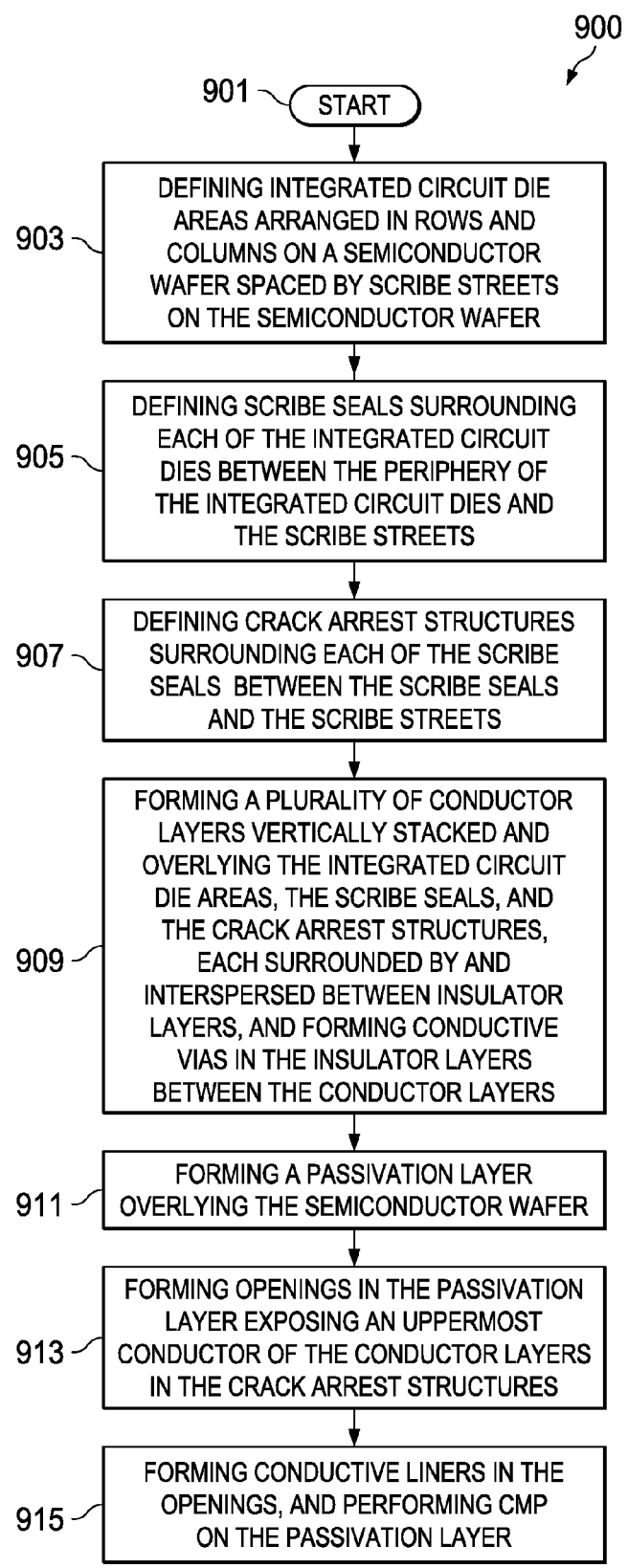
FIG. 9 illustrates in a flow diagram a method embodiment.

FIG. 9 depicts in a flow diagram an example method embodiment 900. In the method illustrated in FIG. 9, the method begins at step 901, Start. At step 903 integrated circuit die areas are defined in rows and columns on a semiconductor wafer and are spaced by scribe streets on the semiconductor wafer.

In step 905, the method includes defining scribe seals surrounding each of the integrated circuit dies and between the periphery of the integrated circuit dies and the scribe streets. In step 907, crack arrest structures are defined surrounding each of the scribe seals.

In step 909, conductor layers are formed vertically stacked and overlying the semiconductor wafer in the integrated circuit die areas, the scribe seals and the crack arrest structures, the conductor layers are surrounded by and interspersed with insulator layers, and conductive vias are formed between the conductor layers in the insulator layers.

In step 911, the method continues by forming a passivation layer overlying the semiconductor wafer. In step 913, the method continues by forming openings in the passivation layer exposing the uppermost conductor of the conductor layers in the crack arrest structures.

In step 915, the conductive liner material is deposited over the passivation layer and into the openings in the passivation layer. CMP is then performed to remove excess liner material over the passivation layer and to planarize the upper surface of the passivation layer. The processing then continues to complete the semiconductor wafer.

The method steps shown in FIG. 9 illustrate one possible order of steps. However, the order of steps is merely illustrative and can be modified to form an alternative embodiments. For example, the steps 903, 905, 907 can be performed simultaneously instead of in the order shown in FIG. 9. These modifications form additional embodiment that are within the scope of the appended claims.

Example embodiments and arrangements include a semiconductor wafer which includes integrated circuit dies with a scribe seal and a crack arrest structure with an opening in a passivation layer. A semiconductor wafer includes a plurality of scribe streets arranged in rows and columns on the surface of the semiconductor wafer; and a plurality of integrated circuit dies arranged in rows and columns and spaced apart by the scribe streets. Each of the integrated circuit dies includes: a plurality of active areas formed in a portion of the semiconductor wafer; a plurality of insulator layers overlying the active areas and the semiconductor wafer; a plurality of conductor layers overlying the semiconductor wafer, the conductor layers interspersed with and separated by ones of the insulator layers; a plurality of conductive vias extending vertically between the active areas and one of the conductor layers, and additional conductive vias extending vertically between and coupling ones of the conductor layers; and a passivation layer overlying a top portion of the uppermost one of the conductor layers. The integrated circuit dies include a scribe seal in a scribe region surrounding the periphery of the integrated circuit die. The scribe seal has the plurality of conductor layers and conductive vias extending through the insulator layers between the conductor layers, the scribe seal forming a vertical conductor structure which surrounds the integrated circuit die at the periphery, the scribe seal covered by the passivation layer.

The integrated circuit dies also include a crack arrest structure in the scribe region overlying the semiconductor wafer located surrounding and spaced from the scribe seal, the crack arrest structure having the plurality of conductor layers and having conductive vias extending through the insulator layers between the conductor layers, the crack arrest structure forming a vertical conductor structure that surrounds the scribe seal in the scribe seal region, and including an opening in the passivation layer that extends to and exposes the upper surface of the uppermost one of the plurality of conductors in the crack arrest structure.

In a further example, the crack arrest structure includes an uppermost one of the layers of conductors having a first width; and the opening in the passivation layer having a second width that is greater than the first width.

In some examples, the crack arrest structure include the second width in which the second width of the opening in the passivation layer is greater than about 5 microns. In yet another example, the crack arrest structure that has a third width of less than about 5 microns. In another example, the semiconductor wafer is provided in which the upper surface of the uppermost one of the layers of conductors is covered by the passivation layer and there is no opening in the passivation layer overlying the scribe seal.

In a further example, the crack arrest structure includes an active area formed within the semiconductor wafer. In an additional example, in the semiconductor wafer, at least one of the conductor layers formed nearest the surface of the semiconductor wafer includes aluminum. In a further example, in the semiconductor wafer, the uppermost one of the conductor layers formed nearest the passivation layer includes copper.

In a further example, the crack arrest structure includes trench vias between the conductor layers, the crack arrest structure forming a vertical barrier that interrupts each of the insulator layers overlying the semiconductor substrate.

In another example, in the semiconductor wafer includes the scribe seal that includes trench vias between the conductor layers, the scribe seal forming a vertical barrier that interrupts each of the insulator layers overlying the semiconductor substrate to prevent a crack in an insulator layers from propagating from the crack arrest structure to the integrated circuit die.

In still another example, in the semiconductor wafer, the opening in the passivation layer exposes the entire upper surface of the uppermost one of the layers of conductors in the crack arrest structure and extends to the scribe seal to expose a portion of the upper surface of the uppermost one of the layers of the conductors in the scribe seal.

In still another example, in the semiconductor wafer, the opening the passivation layer exposes a portion of the upper surface of the uppermost one of the layers of the conductors in the scribe seal, while a remaining portion of the upper surface of the uppermost one of the layers of the conductors in the scribe seal is covered by the passivation layer, and the remaining portion has a width of at least 4 microns.

In another example, the semiconductor wafer includes a conductive layer formed in the openings in the passivation layer to electrically couple to the uppermost conductor layer in the crack arrest structure.

In an example method, a method for decreasing crack damage during semiconductor wafer dicing includes: defining a plurality of integrated circuit die areas on a semiconductor wafer the integrated circuit dies arranged in rows and columns and spaced by a plurality of scribe streets arranged in rows and columns between the integrated circuit dies; defining a scribe seal at the periphery of each of the plurality of integrated circuit dies, the scribe seals positioned between the periphery of the integrated circuit dies and the scribe streets; and defining a crack arrest structure for each of the plurality of integrated circuit dies, the crack arrest structures surrounding the scribe seals and positioned between the scribe seals and the scribe streets. The method continues by forming a plurality of conductor layers vertically stacked and overlying the semiconductor wafer in the integrated circuit die areas, the scribe seals, and the crack arrest structures, the plurality of conductor layers surrounded by and interspersed with insulator layers formed over the semiconductor wafer, and the conductor layers connected by a plurality of conductive vias formed in the insulator layers between the conductor layers in the integrated circuit dies, the scribe seals, and the crack arrest structures. The method then forms a passivation layer of insulator material overlying the semiconductor wafer and covering the integrated circuit dies, the scribe seals, and the crack arrest structures. The example method continues by forming openings in the passivation layer over the crack arrest structures, the opening exposing an uppermost one of the conductor layers in the crack arrest structure. The method concludes by depositing a liner of conductor material over the passivation layer and lining the openings, and performing CMP to remove the liner of conductor material from the upper surface of the passivation layer.

In at least one example, the method further includes forming the opening in the passivation layer by forming an opening having a width that is larger than the width of the uppermost conductor layer of the crack arrest structure.

In still a further example, the method further includes forming the opening in the passivation layer that has a width greater than about 5 microns.

In still another example, the method includes extending the opening in the passivation layer over the crack arrest structure to the scribe seal and exposing at least a portion of the uppermost one of the layer of conductors in the scribe seal. In a further example, the method further includes In yet another example, an integrated circuit includes covering the remaining portion of the uppermost one of the layer of conductors in the scribe seal with the passivation layer.

In another example, an integrated circuit includes a plurality of active areas formed in a portion of a semiconductor substrate; a plurality of insulator layers overlying active areas and the semiconductor substrate; a plurality of conductor layers overlying the semiconductor substrate, interspersed with and separated by ones of the insulator layers; a plurality of conductive vias extending vertically between the active areas and one of the conductor layers, and additional conductive vias extending vertically between ones of the conductor layers; a passivation layer overlying the top portion of the uppermost one of the conductor layers. The integrated circuit further includes a scribe region overlying the semiconductor substrate and surrounding a periphery of the integrated circuit. The scribe region includes a scribe seal having the plurality of conductor layers and having conductive vias extending through the insulator layers between the conductor layers, the scribe seal forming a vertical conductor structure that intersects each of the plurality of insulator layers and which surrounds the integrated circuit at the periphery, and covered by the passivation layer.

The scribe region further includes a crack arrest structure overlying the semiconductor substrate located surrounding and spaced from the scribe seal, the crack arrest structure having the plurality of conductor layers and having conductive vias extending through the insulator layers between the conductor layers, the crack arrest structure forming a vertical conductor structure that intersects each of the insulator layers and which surrounds the scribe seal, and including an opening in the passivation layer that extends to and exposes the upper surface of the uppermost one of the plurality of conductors in the crack arrest structure.

In still a further example, the integrated circuit includes the opening in the passivation layer extending to and exposing a portion of the uppermost one of the plurality of conductors in the crack arrest structure.

In another example, the integrated circuit also includes the opening in the passivation layer that has a width greater than about 5 microns.

Modifications are possible in the described embodiments, and other embodiments are possible within the scope of the claims.

What is claimed is:

1. A semiconductor wafer, comprising:
   a plurality of scribe streets arranged in rows and columns on the surface of the semiconductor wafer;
   a plurality of integrated circuit dies arranged in rows and columns and spaced apart by the scribe streets, each integrated circuit die including:
      a plurality of active areas formed in a portion of the semiconductor wafer;
      a plurality of insulator layers overlying the active areas and the semiconductor wafer;
      a plurality of vertically stacked conductor layers overlying the semiconductor wafer, the conductor layers interspersed with and separated by ones of the insulator layers;
      a plurality of conductive vias extending vertically between the active areas and one of the conductor layers, and additional conductive vias extending vertically through the insulator layers between and coupling ones of the conductor layers;
      a passivation layer overlying the upper surface of the uppermost one of the conductor layers;
      a scribe seal in a scribe region surrounding the periphery of the integrated circuit die, the scribe seal having the plurality of conductor layers and the plurality of insulator layers and having conductive vias extending through the insulator layers between the conductor layers, the scribe seal forming a vertical conductor structure which surrounds the integrated circuit die at the periphery, the scribe seal at least partially covered by the passivation layer; and
      a crack arrest structure in the scribe region overlying the semiconductor wafer located surrounding and spaced from the scribe seal, the crack arrest structure having the plurality of conductor layers and the plurality of insulator layers and having conductive vias extending through the insulator layers between the conductor layers, the crack arrest structure forming a vertical conductor structure that surrounds the scribe seal in the scribe seal region, and including an opening in the passivation layer that extends to and exposes the entire upper surface of a conductor of the uppermost one of the conductor layers within the crack arrest structure and at least a portion of the upper surface of a conductor of the uppermost one of the conductor layers within the scribe seal.

2. The semiconductor wafer of claim 1, wherein:
   the conductor of the uppermost one of the plurality of conductor layers of the crack arrest structure has a first width; and
   the opening in the passivation layer has a second width that is greater than the first width.

3. The semiconductor wafer of claim 2, in which the second width of the opening in the passivation layer is greater than about 5 microns.

4. The semiconductor wafer of claim 2, in which the crack arrest structure has a third width of less than about 5 microns.

5. The semiconductor wafer of claim 1, in which the crack arrest structure includes an active area formed within the semiconductor wafer.

6. The semiconductor wafer of claim 1, in which:
at least one of the conductor layers formed nearest the surface of the semiconductor wafer includes aluminum.

7. The semiconductor wafer of claim 1, in which the uppermost one of the conductor layers formed nearest the passivation layer includes copper.

8. The semiconductor wafer of claim 1, in which the crack arrest structure includes at least one trench via between the conductor layers, the crack arrest structure forming a vertical barrier that interrupts each of the insulator layers overlying the semiconductor wafer.

9. The semiconductor wafer of claim 1, in which the scribe seal includes trench vias between the conductor layers, the scribe seal forming a vertical barrier that interrupts each of the insulator layers overlying the semiconductor wafer to prevent a crack in any one of the insulator layers from propagating from the crack arrest structure to the integrated circuit die.

10. The semiconductor wafer of claim 1, wherein a remaining portion of the upper surface of the conductor of the uppermost one of the conductor layers in the scribe seal is covered by the passivation layer, and the remaining portion has a width of at least 4 microns.

11. A method for decreasing crack damage during semiconductor wafer dicing, comprising:
defining a plurality of integrated circuit die areas on a semiconductor wafer, the integrated circuit dies arranged in rows and columns and spaced by a plurality of scribe streets arranged in rows and columns between the integrated circuit dies;
defining a scribe seal at the periphery of each of the plurality of integrated circuit dies, the scribe seals positioned between an outer periphery of the integrated circuit dies and the scribe streets;
defining a crack arrest structure for each of the plurality of integrated circuit dies, the crack arrest structures surrounding the scribe seals and positioned between the scribe seals and the scribe streets;
forming a plurality of conductor layers vertically stacked and overlying the semiconductor wafer in the integrated circuit die areas, the scribe seals, and the crack arrest structures, the plurality of conductor layers surrounded by and interspersed with insulator layers formed over the semiconductor wafer, and the conductor layers connected by a plurality of conductive vias formed in the insulator layers between the conductor layers;
forming a passivation layer of insulator material overlying the semiconductor wafer and covering the integrated circuit dies, the scribe seals, and the crack arrest structures;
for each integrated circuit die, forming an opening in the passivation layer over the crack arrest structure and the scribe seal, the opening exposing the upper surface of a conductor of the uppermost one of the conductor layers in the crack arrest structure and at least a portion of the upper surface of a conductor of the uppermost one of the conductor layers in the scribe seal;
forming a liner of conductor material overlying the passivation layer and lining the openings in the passivation layer; and
performing a chemical-mechanical polishing (CMP) process to remove the liner of conductor material from the upper surface of the passivation layer.

12. The method of claim 11, in which forming the opening in the passivation layer overlying the uppermost one of the conductor layers in the crack arrest structure includes forming an opening having a width that is larger than a width of the conductor of the uppermost conductor layer in the crack arrest structure.

13. The method of claim 11, in which forming the opening in the passivation layer includes forming an opening that has a width greater than about 5 microns.

14. An integrated circuit, comprising:
a plurality of active areas formed in a portion of a semiconductor substrate;
a plurality of insulator layers overlying active areas and the semiconductor substrate;
a plurality of conductor layers overlying the semiconductor substrate, interspersed with and separated by ones of the insulator layers;
a plurality of conductive vias extending vertically between the active areas and one of the conductor layers, and additional conductive vias extending vertically between ones of the conductor layers;
a passivation layer overlying the top portion of the uppermost one of the conductor layers;
a scribe region overlying the semiconductor substrate and surrounding a periphery of the integrated circuit, further including:
a scribe seal having the plurality of conductor layers and the plurality of insulator layers and having conductive vias extending through the insulator layers between the conductor layers, the scribe seal forming a vertical conductor structure that intersects each of the plurality of insulator layers and which surrounds the integrated circuit at the periphery, and at least partially covered by the passivation layer; and
a crack arrest structure overlying the semiconductor substrate located surrounding and spaced from the scribe seal, the crack arrest structure having the plurality of conductor layers and the plurality of insulator layers and having conductive vias extending through the insulator layers between the conductor layers, the crack arrest structure forming a vertical conductor structure that intersects each of the insulator layers and which surrounds the scribe seal, and including an opening in the passivation layer that extends to and exposes the upper surface of a conductor of the uppermost one of the conductor layers in the crack arrest structure and at least a portion of the upper surface of a conductor of the uppermost one of the conductor layers within the scribe seal.

15. The integrated circuit of claim 14, in which the opening in the passivation layer has a width greater than about 5 microns.

16. The semiconductor wafer of claim 1, wherein the opening in the passivation layer is lined with a conductive liner.

17. The semiconductor wafer of claim 1, wherein at least one of the conductor layers in the scribe seal has a first surface connected to a first conductive via and a second conductive via of the plurality of conductive vias of the scribe seal, wherein the first conductive via is a trench via and the second conductive via is a stitch via, and wherein the second conductive via is located closer to the crack arrest structure than the first conductive via.

18. The semiconductor wafer of claim 17, wherein the first and second conductive vias connect the at least one of the conductor layers of the scribe seal to one of the plurality of active areas.

19. The semiconductor wafer of claim 17, wherein the first and second conductive vias connect the at least one of the conductor layers of the scribe seal to another one of the conductor layers of the scribe seal.

20. The method of claim 11, comprising, for each integrated circuit die, forming, in the scribe seal, first and second conductive vias connected to a first surface of one of the conductor layers of the scribe seal, the first conductive via being formed as a trench via and the second conductive via being formed as a stitch via, and wherein the second conductive via is formed at a location closer to the crack arrest structure than the first conductive via.

21. The integrated circuit of claim 14, wherein at least one of the conductor layers in the scribe seal has a first surface connected to a first conductive via and a second conductive via of the plurality of conductive vias of the scribe seal, wherein the first conductive via is a trench via and the second conductive via is a stitch via, and wherein the second conductive via is located closer to the crack arrest structure than the first conductive via.

* * * * *